United States Patent
Kornilovich et al.

(10) Patent No.: US 7,009,201 B2
(45) Date of Patent: *Mar. 7, 2006

(54) LOW-FORWARD-VOLTAGE MOLECULAR RECTIFIER

(75) Inventors: Pavel Kornilovich, Mountain View, CA (US); Alexendre M. Bratkovski, Mountain View, CA (US); Shun-Chi Chang, Mouontain View, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 4 days.

This patent is subject to a terminal disclaimer.

(21) Appl. No.: 10/703,266

(22) Filed: Nov. 7, 2003

(65) Prior Publication Data

US 2004/0195565 A1    Oct. 7, 2004

Related U.S. Application Data

(62) Division of application No. 10/151,856, filed on May 20, 2002, now Pat. No. 6,670,631.

(51) Int. Cl.
*H01L 51/00*    (2006.01)
(52) U.S. Cl. .......................... 257/40; 257/14
(58) Field of Classification Search ............ 257/40, 257/14; 438/99; 313/504
See application file for complete search history.

(56) References Cited

U.S. PATENT DOCUMENTS 5,057,878 A    10/1991 Geddes et al.
6,858,162 B1 *    2/2005 Kornilovich ............... 252/500

FOREIGN PATENT DOCUMENTS

DE    10013013    10/2000
WO    WO93/25003    12/1993

OTHER PUBLICATIONS

Metzer, Robert M., et al., "Unimolecular Electrial Rectification in Hexadecylquinolinium Tricyanoquinodimethanide," Journal of American Chemcial Society, vol. 119, 1997, pp. 10455-10466.
Krzeminski, C., et al., "Theory of Electrical Rectification in a Molecular Monoloyer," The American Physical Society, Physical Review B, vol. 64, 2001, pp. 088540-1-085405-6.
Aviram, A., et al., "Molecular Rectifiers," Chemical Physics Letters, vol. 29, 1974, pp. 277-283.

(Continued)

*Primary Examiner*—Sara Crane

(57) ABSTRACT

A single molecular species having a low-forward-voltage rectifying property is provided. The molecular species is represented by the formula:

CL-IL-A-IR-CR where A is a "conducting" moiety (with a relatively narrow HOMO-LUMO gap), IL and IR are each an "insulating" moiety (with a relatively wide HOMO-LUMO gap), CL is a connecting group for attachment to a first electrode, and CR is a connecting group for attachment to a second electrode. Also, a low-forward-voltage rectifying molecular rectifier is provided, comprising the molecular species attached between the two electrodes. The present teachings provide a set of design rules to build single-molecule rectifying diodes that operate at low forward and large reverse voltages. Such single-molecule rectifying diodes are useful in a variety of nano-scale applications.

31 Claims, 4 Drawing Sheets

OTHER PUBLICATIONS

Robert A. Metzger—"Demonstration of Unimolecular Electrical Rectification in Hexadecylquinolinium Tricyanoquinodimethanide"—Advanced Materials for Optics and Electronics—Wiley & Sons vol. 8 No. 5 Sep. 1, 1998pp. 229-245.

David I Gittins et al—"Redox-Connected Multilayers of Discrete Gold Particles: A Novel Electroactive Nanomaterial" Advanced Materials vol. 11 No. 9 Jul. 5, 1999 pp. 737-740.

P E Kornilovitch et al—"Current Rectification by Molecules with Asymmetric Tunneling Barriers"—Physical Review B (Condensed Matter and Materials Physics) vol. 66 No. 16 Oct. 15, 2003 pp. 165436-1 thru 165436-11.

Ellenbogen, J.C., et al., "Architectures for molecular electronic computers: 1. Logic structures and an adder designed from molecular electronic diodes," Proceedings of the IEEE, vol. 88, 2000, pp. 386-426.

* cited by examiner

LOW-FORWARD-VOLTAGE MOLECULAR RECTIFIER

CROSS-REFERENCE TO RELATED APPLICATION

The present application is a divisional application of application Ser. No. 10/151,856, filed on May 20, 2002, now U.S. Pat. No. 6,670,631, issued on Dec. 30, 2003.

TECHNICAL FIELD

The present invention relates generally to nanoscale devices, and, more particularly to single-molecule rectifying diodes that operate at low forward and large reverse voltages.

BACKGROUND ART

The emerging field of molecular electronics holds the promise for further miniaturization of computer memory and logic circuits down to nanometer size. At nanoscale dimensions, electronic circuit elements cannot be fabricated by current photolithographic methods. Moreover, many of the conventional methods of transporting, amplifying, and switching currents would not apply when features shrink to a few-nanometer size. Molecular electronics (moletronics) should be able to provide molecular-size replacements for various elements of semiconductor electronics.

One of the major electronic elements is the rectifying diode, which is used for a variety of purposes in analog and digital electronic circuits. Previous proposals for single-molecule rectifying diodes have been mainly discussed in terms of the donor-acceptor mechanism of Aviram and Ratner (AR), see e.g. A. Aviram et al, "Molecular Rectifiers", Chemical Physics Letters, Vol. 29, pp. 277–283 (1974) and J. C. Ellenbogen et al, "Architectures for molecular electronic computers: 1. Logic structures and an adder designed from molecular electronic diodes", Proceedings of the IEEE, Vol. 88, No. 3, pp. 386–426 (2000).

According to the AR mechanism, the two sides of the molecule are covalently attached to two side groups, one of which donates and another withdraws electrons from the central backbone of the molecule. As a result, the electron energy levels in the two parts of the molecule shift in opposite directions. The highest occupied molecular orbital (HOMO) becomes located in one part of the molecule while the lowest unoccupied molecular orbital (LUMO) becomes located in another part of the molecule. This is analogous to n- and p-doping of ordinary semiconductors. Since the levels shift under applied external bias, the HOMO and LUMO align at some voltage $V_F$, thereby facilitating the resonant transport of electrons through the entire length of the molecule. At this voltage $V_F$, the current sharply increases, indicating the opening of the diode in the forward direction. In the reverse direction, the HOMO and LUMO shift away from each other. Therefore, the resonant current picks up when other levels, different from the HOMO and LUMO, align. Since the energy difference between any other two levels is smaller that the HOMO-LUMO gap, the alignment in the reverse direction occurs at a higher voltage $V_R > V_F$. Thus, in the voltage interval $V_R > V > V_F$, the molecule transmits current in the forward direction which is much larger than the current in the reverse direction; that is, the molecule becomes a rectifying diode.

While the mechanism described above indeed provides current rectification, it has two serious drawbacks that make any practical applications of such diodes very difficult, if not impossible. The first drawback is the large typical values of the HOMO-LUMO gap, $E_{HL} > 2$ eV. In order to align the HOMO with the LUMO, an external bias of at least twice the gap is needed. That puts the forward voltage at $V_F > 4$ V. This is, in general, an operating voltage that is too high for a molecular diode. Even if the molecule does not burn out under such a voltage, the voltage drop would be so large that any series connection of such diodes, required for digital logic, would be impossible. The second drawback originates from the fact that, in practice, energy level shifts in the donor-acceptor mechanism are much smaller than $E_{HL}$. As a result, the reverse voltage is only fractionally larger that the forward voltage, $(V_R - V_F)/V_F \ll 1$. At the same time, for memory applications, ratios of at least $V_R/V_F > 5$ are desired.

Thus, the conventional AR rectifying mechanism operates at large absolute values of $V_F$ and small ratios $V_R/V_F$, while moletronic applications require small absolute values of $V_F$ and large ratios $V_R/V_F$. What is needed is a molecular diode that would operate at as small $V_F$ as possible and at as large $V_R$ as possible.

A related molecular diode was discussed by Metzger et al (see, R. M. Metzger et al, Journal of the American Chemical Society, Vol. 119, pp. 10455–10466 (1997); and C. Krzeminski et al, Physical Review B, Vol. 64, pp. 085405(1–6) (2001)). In those experiments, an AR-like donor-acceptor molecule was attached to a long aliphatic chain (such as $-C_{15}H_{31}$) that facilitated the formation of a Langmiur-Blodgett (LB) film on the surface of water. In measuring current-voltage (I-V) characteristics of a molecular monolayer, asymmetry was observed. They noted that the electrical rectification arises from the asymmetric profile of the electrostatic potential across the system. They predicted the behavior contrary to the Aviram-Ratner mechanism: they have asserted that the onset of current at a negative threshold (−1.1V) corresponds to the resonance of the LUMO level with the Fermi level of the donor (D+) side electrode in their case. However, because of the long insulating chain, the measured currents were of order of $10^{-15}$ Ampere per molecule. At such small electric currents, the dominant transport mechanism is most likely to be temperature-assisted or impurity-assisted hopping. Such conductivities are too low for the diodes to be of practical importance.

Thus, what is needed is a molecular diode that would be more conductive and be based on the more effective resonant tunneling transport mechanism.

DISCLOSURE OF INVENTION

In accordance with the embodiments disclosed herein, a single molecular species having a low-forward-voltage rectifying property is provided. The molecular species is represented by the formula:

CL-IL-A-IR-CR where A is a conducting moiety, IL and IR are different insulating moieties, CL is a connecting group for attachment to a first electrode, and CR is a connecting group for attachment to a second electrode.

Also in accordance with the embodiments disclosed herein, a low-forward-voltage rectifying molecular diode, or molecular rectifier, is provided, comprising the above molecular species attached between the two electrodes. The dominant transport mechanism of the diode is elastic resonant tunneling of electrons across the molecules.

The present teachings provide a set of design rules to build single-molecule rectifying diodes that are relatively conductive and operate at low forward and large reverse voltages. Such single-molecule rectifying diodes are useful in a variety of nano-scale applications.

BRIEF DESCRIPTION OF THE DRAWINGS

FIG. 2b depicts the energy state of the molecule under no bias, FIG. 2c depicts the energy state of the molecule under forward bias, and FIG. 2d depicts the energy state of the molecule under reverse bias;

FIGS. 3a–3c, each comprising schematic representations plotted on coordinates of energy and distance, depict the enhancement of the rectification properties of the diode by inhibiting current flow in the reverse direction due to an energy gap in the density of states, wherein FIG. 3a depicts a gap in the density of states of the electrodes, FIG. 3b depicts the situation under forward bias, and FIG. 3c depicts the situation under reverse bias;

FIGS. 5a–5c, on coordinates of energy and distance, each depict the energy structure of the molecule depicted in FIG. 4, wherein FIG. 5a depicts the energy state of the molecular rectifier at rest, FIG. 5b depicts operation of the molecular rectifier in the forward direction, and FIG. 5c depicts the operation of the molecular rectifier in the reverse direction.

BEST MODES FOR CARRYING OUT THE INVENTION

In accordance with the teachings herein, single-molecule rectifying diodes become available that operate at very low forward voltages and large reverse voltages. The low forward voltages and relatively small resistances imply that the diodes may be organized in long series and the voltage drop along the series will be minimal. Consequently, amplification or latching of the digital signal will be required less frequently, effectively increasing the element density and operational speed of the logic circuit. The high reverse voltages imply that even large numbers of such diodes connected in parallel will conduct much less current in the reverse direction than a single diode in the forward direction. This property permits the fabrication of large-scale cross-bar molecular memory arrays.

Figure 1:
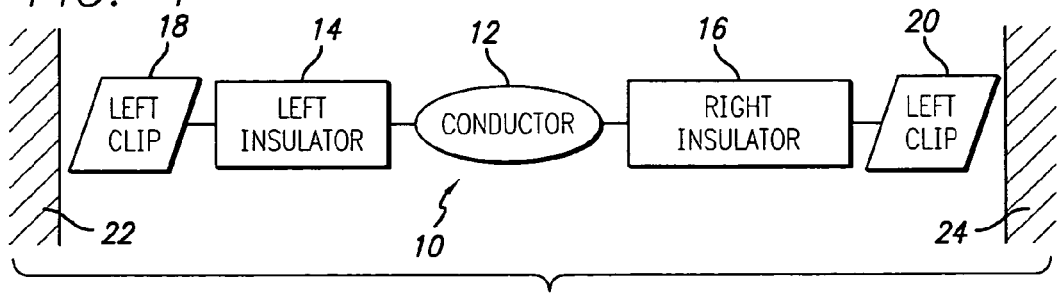
FIG. 1 is a schematic structure depicting an embodiment of a low-forward-voltage single-molecule rectifying diode.

The structural form of the molecular species that is employed in the rectifying diode disclosed and claimed herein is shown in FIG. 1. The rectifying diode molecule 10 consists of one conducting part, or moiety, 12, two insulating bridges, or moieties, 14 and 16, and side groups, or moieties, 18 and 20 to provide chemical connections to a left electrode 22 and a right electrode 24, respectively. The molecule 10 is represented herein as

CL-IL-A-IR-CR where A is the conducting moiety 12, IL is the insulating moiety 14, IR is the insulating moiety 16, CL is the left side connecting group 18, and CR is the right side connecting group 20. When placed between the two electrodes, the combination of the molecule and electrodes forms a rectifying diode, or molecular rectifier, 30.

By "conducting" is meant that the molecule 10, or molecular moiety 12, in its conducting state, has a relatively small HOMO-LUMO gap. Preferably, the HOMO-LUMO gap is within the range of about 2 to 6 eV. Such small HOMO-LUMO gap molecules include fullerenes and their derivatives, conjugated aromatics, such as benzene, fused aromatic carbocycles, such as naphthalene and anthracene, derivatives of such conjugated or fused aromatics, and conjugated polymers, including, but not limited to, polyacetylenes. The central conjugated unit 12 may further contain unsaturated groups such as homoaromatics, heteroaromatics with S (terthiophene) or O, and pyridine with or without —C=C—, —N=C—, and —C≡C— spacers/linkers. The conjugated portion may contain more complex units such as tetrathiofulvalene (TTF) and tetracyanoquinodimethane (TCNQ).

By "insulating" is meant that the molecule 10, or molecular moiety 14, 16, in its insulating state has a relatively large HOMO-LUMO gap. Preferably, the HOMO-LUMO gap is within the range of about 6 to 10 eV. Such large HOMO-LUMO gap molecules include saturated aliphatic hydrocarbons —(CH$_2$)$_n$—, both cyclic and acyclic, and other typical monomer units used for polymeric materials, including biopolymers, such as sugars, amino acids, and nucleic acids. Rectification is achieved by ensuring that IL 14 is not the same as IR 16. For example, both moieties could be saturated aliphatic, but of different values of n.

The shorter insulating spacer, here 14, controls the width of the energy resonance and therefore the current rectification ratio. The longer insulating spacer, here 16, controls the overall resistance/conductance of the rectifier 30. Finally, the length ratio of the two insulating spacers 14, 16 controls the voltage division between the two barriers and therefore the asymmetry of the current-voltage characteristics and the rectification ratio of the rectifier 30.

The connecting groups 18, 20 that link the insulating moieties 14, 16, respectively, to the electrodes 22, 24 may be thiols (—SH) to facilitate attachment to gold electrodes, NC—C—CN to facilitate attachment to aluminum electrodes, and/or amphiphilic/amphophobic groups to facilitate the formation of Langmuir-Blodgett films. Other connecting groups for connecting to other electrode metals will be readily apparent to those skilled in this art.

The molecules 10 may be terminated by connecting groups 18, 20 that help to orient or attach the molecules to electrodes 22, 24. The molecules 10 may be oriented in a Langmuir-Blodgett trough, they may be attached to an electrode as a self-assembled monolayer, or they may be deposited in any fashion that will form a dense and highly oriented monolayer. One or both connecting groups 18, 20 may be absent.

The connecting groups would be absent if formation of covalent bonds between the molecules 10 and the electrodes 22, 24 is not required for some reason. In this case, molecules 10 would be coupled to the electrodes 22, 24 via the weaker van der Waals, hydrogen, or ionic (Coulomb) bonds. The electrons would go from the electrode 22, 24, across a vacuum gap, directly to the insulating moieties 14, 16.

The working principle of the molecular rectifier 30 disclosed and claimed herein is based on the two asymmetries: (1) spatial asymmetry and (2) energy asymmetry.

The spatial asymmetry means that the conductive part 12 of the molecule 10, which can be thought of as a nanometer-size quantum dot, is shifted from the middle of the molecule towards one of the electrodes, here, 22. This is achieved by making one insulating part, here 16, longer than the other, here 14, as depicted in FIG. 1. As a result, most of the voltage drop will occur on the insulating moiety 16. The chemical potential of the conducting moiety 12 will remain nearly unchanged and equal to the Fermi energy of the closest electrode (the left electrode 22 in FIG. 1).

Figure 2A:
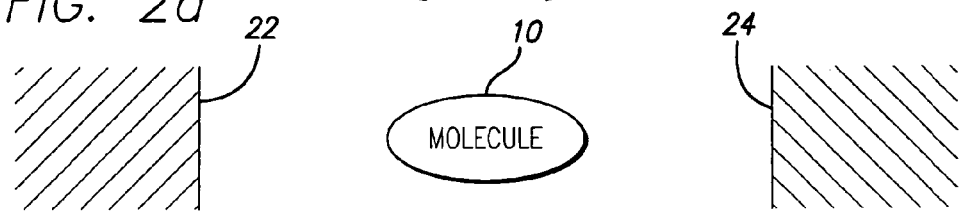
FIGS. 2a–2d, each comprising schematic representations plotted on coordinates of energy and distance, depict the basic principle of the molecular rectification of the molecular rectifying diode, wherein FIG. 2a schematically depicts a molecule between two metal electrodes.

The energy asymmetry means that the equilibrium Fermi energy 26 of the electrodes 22, 24 lies much closer to the molecular LUMO than to the HOMO; in this connection, see FIG. 2a. (By definition of the conductive part, both the LUMO and the HOMO are located on the conducting moiety 12.) In principle, the Fermi level 26 could lie closer to the HOMO instead, but such a situation is unlikely to happen in practice. The typical values of $E_F$ (electrode work function) and $E_{LUMO}$ (molecular affinity) are both in the same energy range, about 2 to 5 eV, while typical values of $E_{HOMO}$ (ionization energies of the molecules) are larger, about 7 to 9 eV. The energy asymmetry can be manipulated by changing the electrode material (metals with different work function) and the doping level (for semiconducting electrodes) and by changing the composition of the conducting part 12 of the molecular rectifier 30. For instance, a larger conducting moiety 12, e.g., anthracene, has a smaller HOMO-LUMO gap and larger absolute value of $E_{LUMO}$ than a smaller conducting moiety, e.g., phenyl. The use of heterocycles allows an even finer tuning of the LUMO energy. For instance, one nitrogen in a six-member ring shifts the LUMO down by about 0.2 eV, two nitrogens by about 0.4 eV, etc.

Figure 2B:
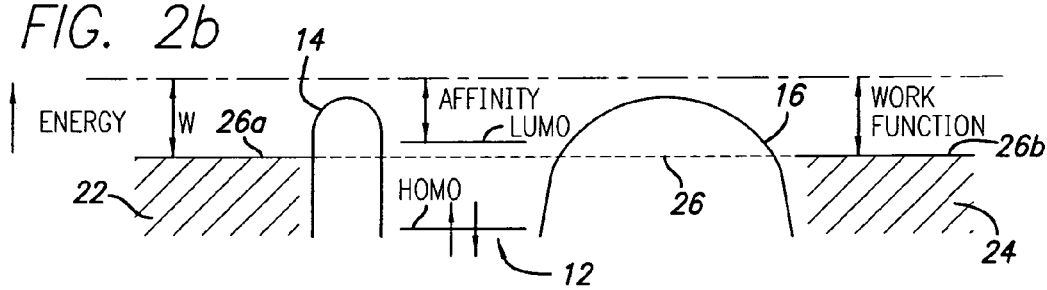
Figure 2C:
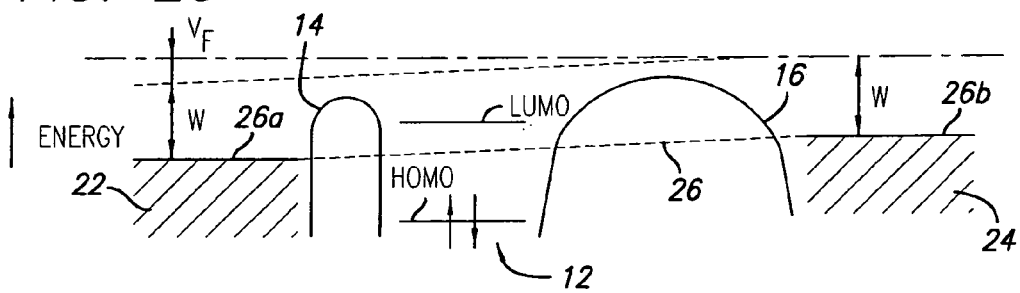
Figure 2D:
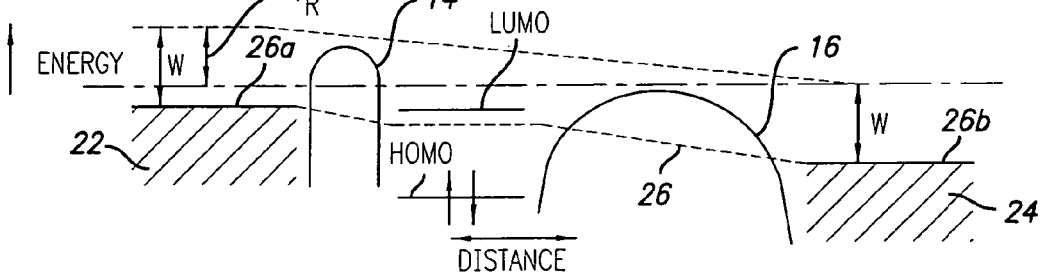

FIGS. 2a–2d depict the basic principle of the rectification of the molecular diode, employing energy diagrams. FIG. 2a schematically depicts a molecule between two metal electrodes 22, 24. FIGS. 2b–2d depict the effect of bias on the Fermi level 26, where W is the work function of the metal and AFFINITY is the electron affinity of the molecule 10. FIG. 2b depicts a molecule 10 with AFFINITY less than W and with different lengths of the insulating barriers 14, 16 is connected to two metallic leads 22, 24, respectively. FIG. 2c depicts that under forward bias $V_F$, the current rises when the right Fermi level 26b aligns with the conducting molecular level (LUMO). FIG. 2d depicts that under reverse bias $V_R$, the current rises when the left Fermi level 26a aligns with the conducting molecular level (LUMO). Since most of the total voltage drops on the right insulation barrier 16, $V_R > V_F$. It will be noted that the connecting moieties 18, 20 are omitted, since their presence has minimal, if any, effect on the foregoing analysis.

As used herein, the terms "work function" and "Fermi energy level" are essentially interchangeable, both for metals and degenerate (highly doped) semiconductors. The only difference between metals and semiconductors is that in the case of semiconductors, the affinity is given and the position of the Fermi level can be controlled by doping, while in metals, the Fermi energy/work function is fixed and cannot be controlled.

It will be noted that the insulating units 14 and 16 affect the electrical properties of the molecular rectifier 30 in different ways. The shorter unit, here 14, determines the largest (of the two) coupling of the conducting unit 12 with the electrodes 22, 24, and, consequently, the sharpness of the energy resonance, as mentioned above. The sharper the resonance, the steeper the current rise close to the resonance and the better the rectifier. The longer unit, here 16, determines the voltage division between the two barriers and the overall resistance/conductance of the molecular rectifier 30, as also mentioned above. A longer unit 16 reduces $V_F$ and increases $V_R/V_F$, resulting in better rectification. However, a too long unit 16 reduces the overall current and increases the RC time constant of the device 30. In practice, the molecular rectifier 30 has to be designed such as to achieve an optimum compromise between the rectification ratio and time constant of the device.

The present molecular rectifier 30 acquires additional properties if used with semiconductor electrodes that have energy gaps in their density of states.

Figure 3A:
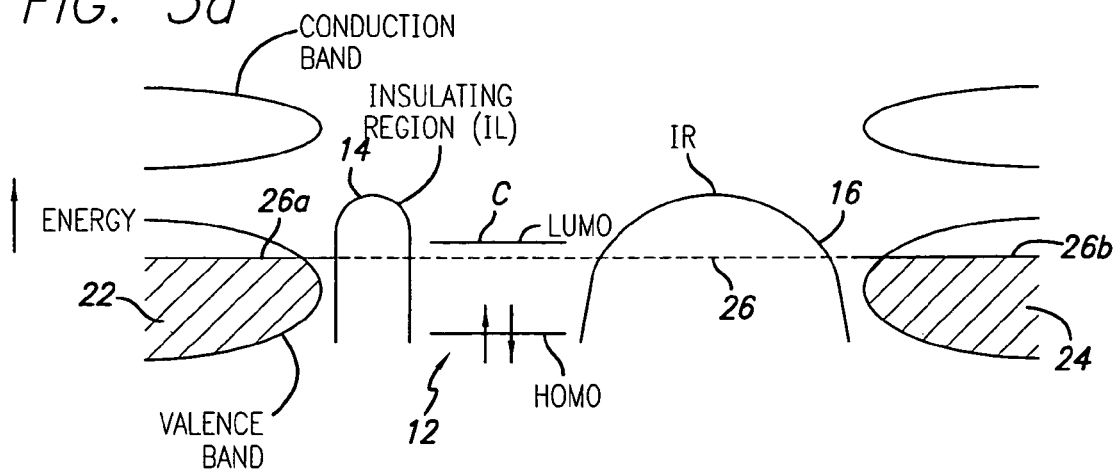
Figure 3B:
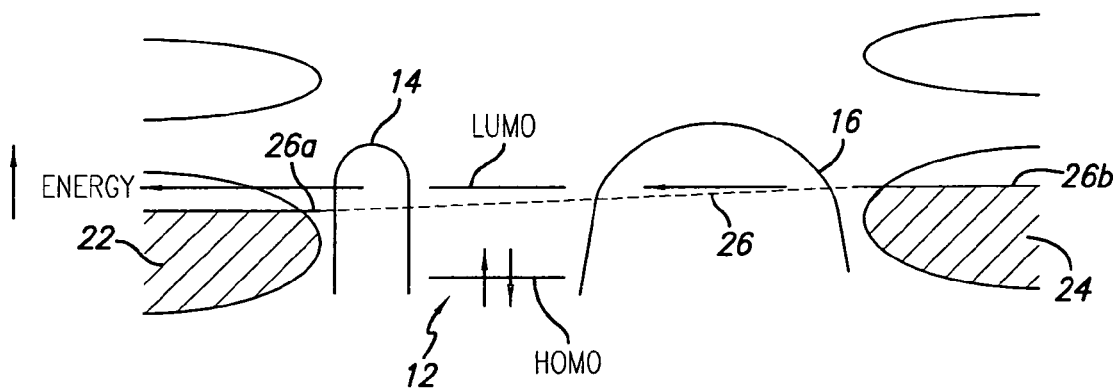
Figure 3C:
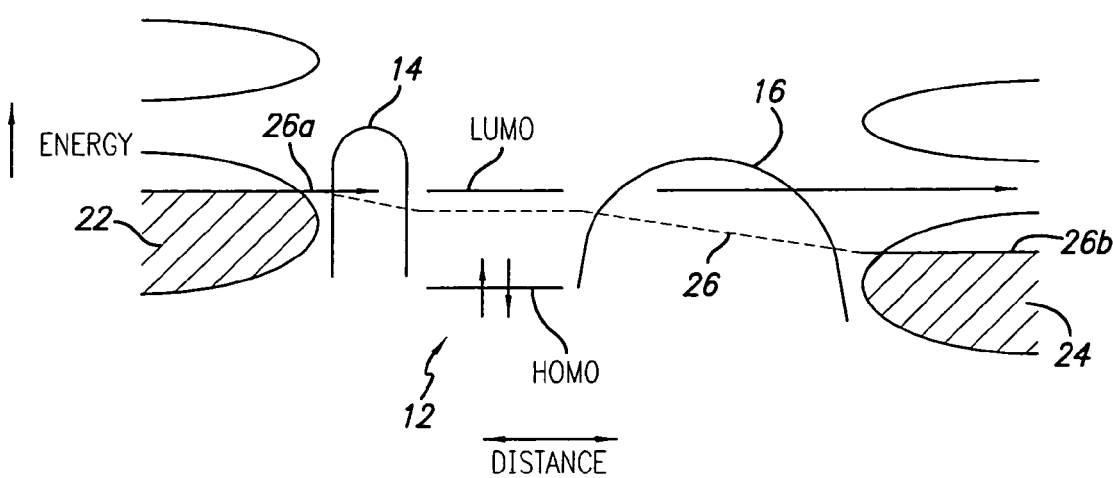

FIGS. 3a–3c illustrate the enhancement of the rectification properties of the rectifier 30 by inhibiting current flow in the reverse direction due to an energy gap in the density of states. Again, connecting moieties 18, 20 are omitted. FIG. 3a shows a gap in the density states of the electrodes 22, 24. At some voltage $V_g$, the bottom of the gap aligns with the conducting molecular orbital (LUMO). At higher $V > V_g$, resonant tunneling becomes impossible due to the lack of available final electronic states. Accordingly, the current must drop to zero at $V = V_g$. If $V_g$ lies in between $V_F$ and $V_R$, then there will be some substantial current in the forward direction in the interval $V_F < V < V_g$ (FIG. 3b), while no current at all in the reverse direction (FIG. 3c). That is, under forward bias (FIG. 3c), when the right Fermi level 26b aligns with the LUMO, there are still states available in the left electrode 22, and the current flows. On the other hand, under reverse bias (FIG. 3c), by the time the left Fermi level 26a aligns with the LUMO, there are no states available in the right electrode 24, and the current is blocked.

Such molecular rectifiers 30 will display large negative differential resistance under positive bias. In this respect, they behave similarly to the conventional semiconducting tunneling diodes. However, under negative bias, the behavior is quite different. While the tunneling diodes conduct very well under the reverse bias, the molecular rectifiers 30 disclosed herein conduct very little.

One important parameter that determines the forward turn-on voltage is the energy difference between the Fermi energy of the electrodes 22, 24 and the LUMO of the rectifier 30, which depends on the work function of the metal and affinity of the central conjugated segment of the molecule. This energy difference can be adjusted by several different procedures in order to optimize the over-all performance of the rectifier 30 and the circuits in which it is used: (1) utilizing different electrode materials with a different work function (or Fermi energy position determined by doping if the electrode is semiconducting), and (2) utilizing different A groups to adjust the HOMO-LUMO gap or the electron affinity. Note that the HOMO and LUMO can both be on the A component, but it is also possible for the HOMO to belong to the connecting group 18, 20 to the electrode 22, 24, respectively. By changing the connecting group 18, 20, it is possible to tune the HOMO-LUMO gap independent of the nature of A or the insulating components 14, 16 of the rectifier 30.

In one preferred embodiment, the electrodes 20, 22 are both semiconductors and have gaps in the density of states lying close to the conducting level of the molecular rectifier 30. Preferably, the gaps in the density of states result in blocking the resonant current through the molecular rectifier 30. Finally, most preferably, the rectifier 30 displays a strong negative differential resistance effect.

In another preferred embodiment, the main transport mechanism is resonant tunneling of electrons between the electrodes 22, 24 through a conducting molecular orbital located on A.

Figure 4:
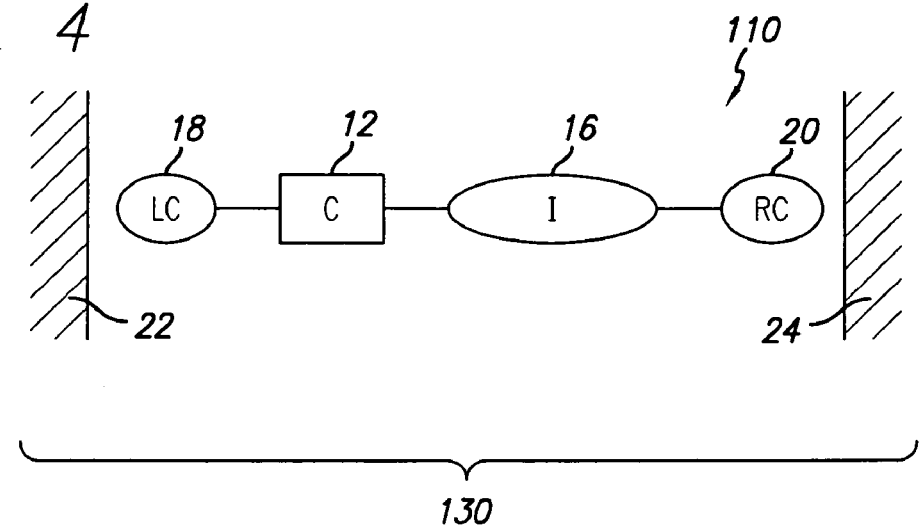
FIG. 4 is a schematic structure similar to that of FIG. 1, but depicting an alternative embodiment of the molecular rectifier.

In a special case of the foregoing rectifying diode molecule 10, a modified rectifying molecule 110 is depicted in FIG. 4. In this case, one of the insulating moieties, here, 14, is omitted. The molecular rectifier device is denoted 130.

Figure 5A:
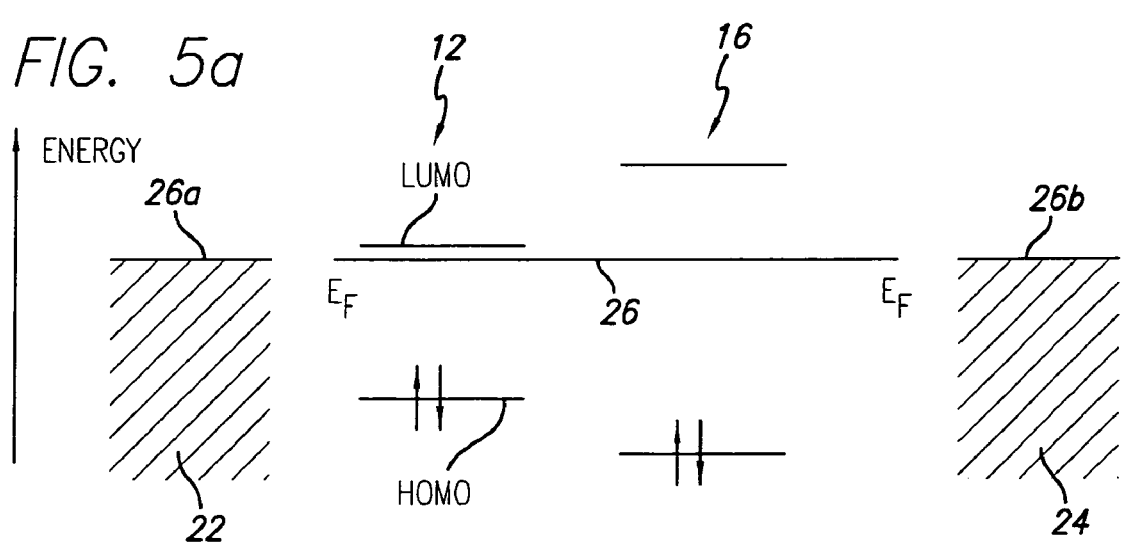

Now consider the operation of the device 130 comprising electrode 22, electrode 24, and rectifying molecule 110 therebetween. The energy structure of the device 130 in the absence of any bias is depicted in FIG. 5a.

Figure 5B:
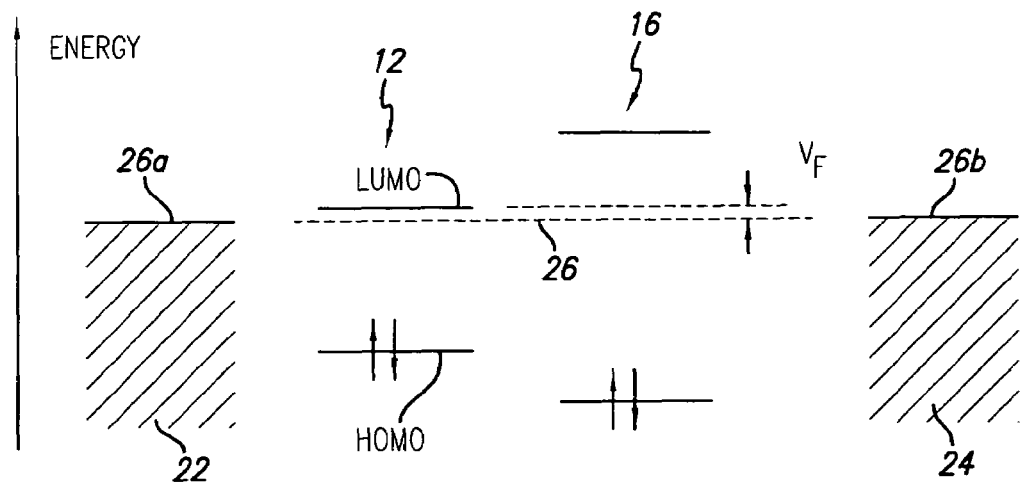
Figure 5C:
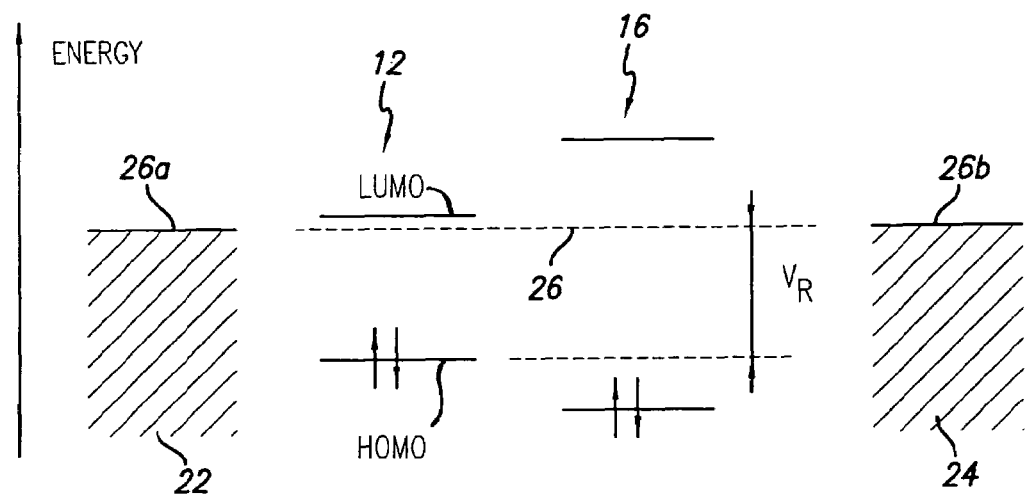
Figure 6:
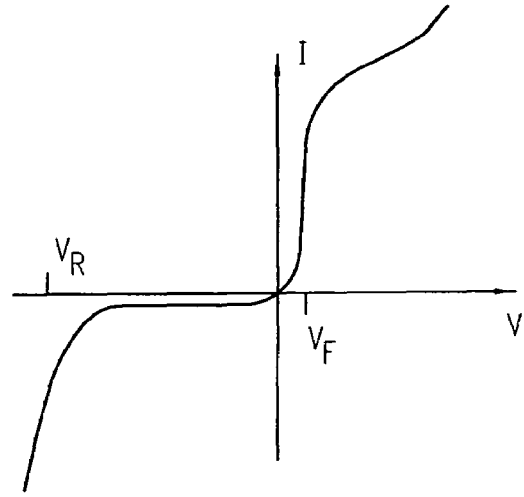
FIG. 6, on coordinates of current (I) and voltage (V), depict the current-voltage characteristics of the molecular rectifier, $V_R \gg V_F$.

To a first approximation, one can assume that the entire voltage drops on the longer insulating part 16. This happens because of two factors. Firstly, the insulating part 16 is physically longer than the conductive part 12. Secondly, the insulating part 16 has a lower dielectric constant, hence a higher electric field. Thus, referring to FIG. 5b, the LUMO remains fixed with respect to the left Fermi level 26a but moves with respect to the right Fermi level 26b. So, under forward bias, the right Fermi level 26b has to cross only a small energy distance $E_{LUMO}-E_F$ in order to produce a sizable electric current flowing through a conducting LUMO. On the other hand, under reverse bias, as depicted in FIG. 5c, the right Fermi level 26b has to cross a large energy difference $E_F-E_{HOMO}$, to produce a sizable current flowing through a conducting HOMO. As a result, the full current voltage characteristic will be highly asymmetric, producing the desired rectifying effect, as shown in FIG. 6.

It should be emphasized once again that the manipulation with constituent elements of the conducting moiety 12 allows nearly arbitrary adjustment of $E_{LUMO}$. Additional tuning ability is provided by using electrodes 22, 24 with different work functions. For instance, consider platinum (Pt) with $E_F=-5.6$ eV and aluminum (Al) with $E_F=-4.2$ eV. With the molecular LUMO at $E_{LUMO}=-5.0$ eV, the use of both Pt electrodes would lead to a too large forward bias of about 0.6 V. At the same time, the use of both Al electrodes would result in the LUMO getting below $E_F$. This would lead to charging of the molecule 110 and breaking off of the entire device 130.

However, the use of one Pt electrode (left electrode 22) and a second Al electrode (right electrode 24) would create an internal field that would pull the LUMO down by a fraction of the work function difference of 1.4 eV. As a result, the LUMO will get closer to $E_F$, thereby reducing the forward bias and improving the performance of the rectifier 130. Thus, the LUMO can be designed to lie rather close to the pre-specified Fermi energy 26 of the electrodes 22, 24, thereby resulting in a small absolute value of $V_F \ll E_{HL}$. The smaller $V_F$ is, the more effective the rectifier 130 is. At the same time, the HOMO-LUMO gap is an internal characteristic of the molecule 110 and is always finite, $E_{HL}>2$ eV. Consequently, $V_R \approx E_{HL}$ and $V_R/V_F \gg 1$.

The present mechanism provides molecular rectifiers 30, 130 with precisely those characteristics that allow a variety of logic and memory moletronic applications.

Three specific examples of single molecules 10, 110 suitable for use as molecular rectifiers 30, 130 are shown below (without the electrodes). The corresponding electrodes have to be chosen such as to minimize the energy difference $E_{LUMO}-E_F$ in order to have the lowest possible value of $V_F$.

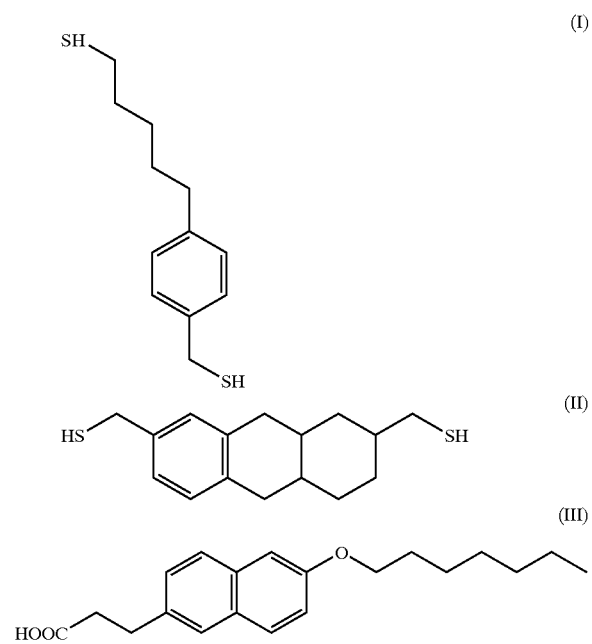

In Formula (I), the conducting moiety 12 is the benzene ring and the connecting groups 18, 20 are —SH. The insulating moiety 14 is given by the —(CH$_2$)— group, while the insulating moiety 16 is given by the —(CH$_2$)$_4$ group. In Formula (II), the conducting moiety 12 is again given by the benzene ring and the connecting groups 18, 20 are also —SH. The insulating moiety 14 is given by the —(CH$_2$)— group, while the insulating moiety 16 is given by the methyl-substituted two fused cyclohexane rings (methyl-decahydronaphthalene). In Formula (III), the conducting moiety 12 is the 2-naph-thalenol group. The insulating group 14 is given by the —(CH$_2$)$_2$— group, while the insulating moiety 16 is given by the —O—(CH$_2$)$_6$—CH$_3$ group. The connecting moiety 18 is given by the —COOH group. The connecting moiety 20 is absent in this formula.

The technology disclosed and claimed herein for forming molecular rectifiers may be used to perform a variety of functions and to form a variety of useful devices and circuits for implementing computing on a microscale and even on a nanoscale. For example, applications include molecular wire crossbar interconnects (MWCI) for signal routing and communications, molecular wire crossbar memory (U.S. Pat. No. 6,128,214), molecular wire crossbar logic (MWCL) employing programmable logic arrays, a demultiplexer for a molecular wire crossbar network, molecular wire transistors, and pixel arrays for displays.

INDUSTRIAL APPLICABILITY

There has been disclosed a single molecular species that functions as low-forward-voltage rectifying molecular diode for nanometer-scale device applications.

What is claimed is:

1. A single molecular species having a low-forward-voltage rectifying property, said molecular species represented by the formula:

CL-IL-A-IR-CR where A is a conducting moiety, IL is a first insulating moiety, IR is a second insulating moiety not the same as IL, CL is a first connecting group for attachment to a first electrode, and CR is a second connecting group for attachment to a second electrode and where A has a relatively small HOMO-LUMO gap compared to both IL and IR.

2. The molecular species of claim 1 wherein A has a HOMO-LUMO gap within a range of about 2 to 6 eV.

3. The molecular species of claim 1 wherein A contains either a low-lying empty state (LUMO) or a large electron affinity.

4. The molecular species of claim 3 wherein A is selected from the group consisting of conjugated homo-cycle aromatics, hetero-cycle aromatics, conjugated hydrocarbon chains, and fullerenes.

5. The molecular species of claim 1 wherein IL and IR each have a HOMO-LUMO gap within a range of about 6 to 10 eV.

6. The molecular species of claim 1 wherein IL and IR are selected from the group consisting of saturated cyclic hydrocarbons, saturated acyclic hydrocarbons, sugars, amino acids, nucleic acids, and monomers of polymers having said relatively large HOMO-LUMO gap.

7. The molecular species of claim 1 wherein said connectors CL, CR are selected from the group consisting essentially of thiols, thiol-terminated alkenes, and —COOH-terminated chains or groups.

8. The molecular species of claim 1 wherein at least one of said connectors CL, CR is absent.

9. The molecular species of claim 1 wherein said electrodes are the same or different and are either metallic or semiconductor.

10. A low-forward-voltage molecular rectifier comprising a single molecular species having a low-forward-voltage rectifying property, said molecular species attached between two electrodes and represented by the formula:

CL-IL-A-IR-CR where A is a conducting moiety, IL is a first insulating moiety, IR is a second insulating moiety not the same as IL, CL is a first connecting group for attachment to a first said electrode, and CR is a second connecting group for attachment to a second said electrode and where A has a relatively small HOMO-LUMO gap compared to both IL and IR.

11. The molecular rectifier of claim 10 wherein A has a HOMO-LUMO gap within a range of about 2 to 6 eV.

12. The molecular rectifier of claim 10 wherein A contains either a low-lying empty state (LUMO) or a large electron affinity.

13. The molecular rectifier of claim 12 wherein A is selected from the group consisting of conjugated homo-cycle aromatics, hetero-cycle aromatics, conjugated hydrocarbon chains, and fullerenes.

14. The molecular rectifier of claim 10 wherein IL and IR each have a HOMO-LUMO gap within a range of about 6 to 10 eV.

15. The molecular rectifier of claim 10 wherein IL and IR are selected from the group consisting of saturated cyclic hydrocarbons, saturated acyclic hydrocarbons, sugars, amino acids, nucleic acids, and monomers of polymers having said relatively large HOMO-LUMO gap.

16. The molecular rectifier of claim 10 wherein said connectors CL, CR are selected from the group consisting essentially of thiols, thiol-terminated alkenes, and —COOH-terminated chains or groups.

17. The molecular rectifier of claim 10 wherein at least one of said connectors CL, CR is absent.

18. The molecular rectifier of claim 10 wherein said electrodes are the same or different and are either metallic or semiconductor.

19. The molecular rectifier of claim 10 wherein (a) said electrodes are metal, each metal electrode having a Fermi energy level and a work function, (b) said rectifier has a HOMO and a LUMO, separated by a gap, and (c) said A moiety has an electron affinity, and wherein a parameter that determines forward turn-on voltage of said rectifier is an energy difference between said Fermi energy of said metal electrodes and said LUMO of said rectifier, which depends on said work function of said metal and said affinity of said A moiety.

20. The molecular rectifier of claim 19 wherein said energy difference is adjusted by utilizing different electrode materials with (a) a different work function where said electrodes are metal or (b) a Fermi energy position determined by doping where said electrode are semiconducting to thereby optimize over-all performance of said rectifier and circuits in which it is used.

21. The molecular rectifier of claim 19 wherein said energy difference is adjusted by selecting an appropriate A moiety to adjust said HOMO-LUMO gap or said electron affinity.

22. The molecular rectifier of claim 21 wherein said HOMO and LUMO are both on said A moiety.

23. The molecular rectifier of claim 21 wherein said HOMO is on one of said connecting groups attached to a said electrode.

24. The molecular rectifier of claim 23 wherein at least one said connecting group is selected for tuning said HOMO-LUMO gap independent of said A moiety or said insulating moieties of said rectifier.

25. The molecular rectifier of claim 10 wherein a transport mechanism is resonant tunneling of electrons between said electrodes through a conducting molecular orbital located on said A moiety.

26. The molecular rectifier of claim 10 wherein one of said insulating moieties is shorter than the other, and said shorter insulating moiety controls width of an energy resonance and therefore a current rectification ratio.

27. The molecular rectifier of claim 10 wherein one of said insulating moieties is longer than the other, and said longer insulating moiety controls overall resistance/conductance of said rectifier.

28. The molecular rectifier of claim 10 wherein a ratio in length of said two insulating moieties controls a voltage division between two energy barriers formed by said two insulating moieties and therefore asymmetry of current-voltage characteristics and a rectification ratio of said rectifier.

29. The molecular rectifier of claim 10 wherein said electrodes are semiconductors and have gaps in a density of states lying close to a conducting level of said rectifier.

30. The molecular rectifier of claim 29 wherein said gaps in said density of states result in blocking resonant current through said rectifier.

31. The molecular rectifier of claim 30 wherein said rectifier displays a strong negative differential resistance effect.

* * * * *